United States Patent
Ma et al.

(10) Patent No.: US 10,197,863 B2
(45) Date of Patent: Feb. 5, 2019

(54) MASK AND PHOTO ALIGNMENT METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Guojing Ma, Beijing (CN); Changjian Xu, Beijing (CN); Dan Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/534,055

(22) PCT Filed: May 5, 2016

(86) PCT No.: PCT/CN2016/081104
§ 371 (c)(1),
(2) Date: Jun. 8, 2017

(87) PCT Pub. No.: WO2017/161644
PCT Pub. Date: Sep. 28, 2017

(65) Prior Publication Data
US 2018/0107073 A1  Apr. 19, 2018

(30) Foreign Application Priority Data

Mar. 24, 2016 (CN) .......................... 2016 1 0171864

(51) Int. Cl.
G02F 1/1337 (2006.01)
G01B 11/14 (2006.01)
(Continued)

(52) U.S. Cl.
CPC ........ *G02F 1/133753* (2013.01); *G01B 11/14* (2013.01); *G02F 1/1303* (2013.01);
(Continued)

(58) Field of Classification Search
CPC ..................................................... G02F 1/1337
See application file for complete search history.

(56) References Cited

U.S. PATENT DOCUMENTS 9,352,843 B2  5/2016  Liu
9,366,908 B2  6/2016  Xiong
(Continued)

FOREIGN PATENT DOCUMENTS

CN  101470343 A   7/2009
CN  102466963   *  5/2012  ........... G02F 1/1339
(Continued)

OTHER PUBLICATIONS

Search Report for International Application No. PCT/CN2016/081104 dated Nov. 10, 2016.
(Continued)

*Primary Examiner* — Sang V Nguyen
(74) *Attorney, Agent, or Firm* — Calfee, Halter & Griswold LLP

(57) ABSTRACT

A mask including a plurality of baffles, a frame and a light transmission region, and a photo alignment method are provided. A support component and a movable component are disposed on the frame. The baffle is configured to block the light transmission region. The support component is configured to support the baffle which blocks the light transmission region. The movable component is configured to move the baffle to a position blocking the light transmission region.

8 Claims, 5 Drawing Sheets

(51) Int. Cl.
*G02F 1/13* (2006.01)
*G03F 1/42* (2012.01)
*H05K 3/00* (2006.01)

(52) U.S. Cl.
CPC .......... *G02F 1/133788* (2013.01); *G03F 1/42* (2013.01); *H05K 3/0002* (2013.01)

(56) References Cited

U.S. PATENT DOCUMENTS

| | | | | |
|---|---|---|---|---|
| 2002/0051915 | A1* | 5/2002 | Karamatsu | G03F 7/70066 430/22 |
| 2010/0109220 | A1* | 5/2010 | Musha | B65G 49/061 269/7 |
| 2012/0103255 | A1* | 5/2012 | Fukuda | C23C 14/042 118/668 |
| 2013/0023007 | A1* | 1/2013 | Zahniser | G06T 7/0012 435/34 |
| 2014/0179190 | A1* | 6/2014 | Lee | G02F 1/1303 445/24 |
| 2014/0286735 | A1 | 9/2014 | Liu | |
| 2014/0353520 | A1* | 12/2014 | Xiong | G02F 1/133753 250/454.11 |

FOREIGN PATENT DOCUMENTS

| | | |
|---|---|---|
| CN | 102466963 A | 5/2012 |
| CN | 202372754 U | 8/2012 |
| CN | 203117640 U | 8/2013 |
| CN | 103336389 A | 10/2013 |
| CN | 104267542 A | 1/2015 |
| EP | 1189111 A1 | 3/2002 |

OTHER PUBLICATIONS

Second Office Action for Chinese Patent Application No. 20160171864.9 dated Jun. 14, 2017.
Office Action for Chinese Patent Application No. 201610171864.9 dated Feb. 6, 2017.

* cited by examiner

Determining times of photo alignment and a required number and required positions of the baffles for each time of photo alignment before alignment During the process of alignment, the baffles block the light transmission region of the mask, and the alignment light irradiates the unblocked portion

MASK AND PHOTO ALIGNMENT METHOD

CROSS-REFERENCE TO RELATED APPLICATIONS

The present application is based upon International Application No. PCT/CN2016/081104, filed on May 5, 2016, which is based upon and claims priority to Chinese Patent Application No. 201610171864.9, filed Mar. 24, 2016, the entire contents of which are incorporated herein by reference as a part of the present application.

TECHNICAL FIELD

The present disclosure relates to the field of photo alignment technology, and more particularly, to a mask and a photo alignment method.

BACKGROUND

With the development of display technology and social progress, liquid crystal display technology has been more and more widely used and has played an important role in industrial production and daily lives.

Conventional methods for causing a liquid crystal on a liquid crystal display panel to a predetermined tilt angle include a contact-type rubbing orientation method and a non-contact-type photo alignment orientation method. In the rubbing orientation method, a surface of a film to be aligned is rubbed with a flannel roller, so that molecules of the surface of the film to be aligned are arranged in a specific direction by a physical pressure applied. When the film to be aligned is rubbed by the roller, it tends to cause dust particles and electrostatic residues and other undesired friction, affecting the product yield. Therefore, at present, more production lines using the photo alignment orientation method to align the alignment film.

In the photo alignment orientation method, a substrate is irradiated with a polarized light which is obtained by passing an ultraviolet light through a polarizing plate, to align an alignment film and make the surface of the alignment film to have an optical anisotropy. Compared with the rubbing orientation method, the photo alignment orientation method can effectively improve the product yield and the stability of the production equipment. In the photo alignment orientation method, a mask is a carrier for an original pattern of the exposure process, and a tool for transferring the fine pattern, which is used for the mass reproduction of the product and has a key role in the production.

In a traditional production process, one substrate corresponds to one product, while different products correspond to different patterns and require different masks. Later, in order to improve the utilization of the substrate, the mask and the photo alignment equipment, a multi-model group (MMG) technique was developed for simultaneously fabricating a plurality of products on the same substrate. In the existing Multi Model Group (MMG) technology, the same substrate contains a plurality of products with different patterns, which can reduce the number of substrates, but also makes the masks more complex. The cost of the mask is expensive and the accuracy requirement is high, and the cost for designing, manufacturing, shipping, storing, replacing and installation and other processes is high, imposing a greater burden on the designer and the producer. How to reduce the number of masks and reduce the probability of damage has become the key to reduce costs.

It should be noted that, information disclosed in the above background portion is provided only for better understanding of the background of the present disclosure, and thus it may contain information that does not form the prior art known by those skilled in the art.

SUMMARY

Embodiments of the present disclosure provide a mask which can correspond to different products.

According to a first aspect of the present disclosure, there is provided a mask, comprising a plurality of baffles, a frame and a light transmission region. A support component and a movable component are disposed on the frame. The baffles are configured to block the light transmission region. The support component is configured to support the baffle which blocks the light transmission region. The movable component is configured to move the baffle to a position blocking the light transmission region.

According to a second aspect of the present disclosure, there is provided a photo alignment method using the above mask, comprising: determining required times of photo alignment and an area required to be blocked on the light transmission region of the mask for each time of photo alignment, according to positions of products arranged on the substrate. Determining a required number and required positions of the baffles according to the area required to be blocked on the light transmission region of the mask for each time of photo alignment. When each time of photo alignment is performed, according to the required number and the required positions of the baffles for the current time of photo alignment, moving the baffles to reach to corresponding positions, to block at least portion of the light transmission region of the mask, and then, irradiating the substrate with an alignment light passing through the mask.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to more clearly illustrate the technical solutions in embodiments of the present disclosure, the following drawings of the embodiments will be briefly introduced below. Apparently, the drawings in the following description are only for some embodiments of the disclosure, rather than limitations to the present disclosure, wherein.

DETAILED DESCRIPTION

In order to make the objective, technical solutions and advantages of the embodiments of the present disclosure to be more apparent, the technical solutions in the embodiments of the present disclosure will be clearly and thoroughly described below in combination with the drawings. Apparently, the described embodiments are merely part of the embodiments and not all of the embodiments of the present disclosure. Based on the embodiments of the present disclosure, all other embodiments obtained by those of ordinary skill in the art without making creative effort are within the protection scope of the present disclosure.

Figure 1:
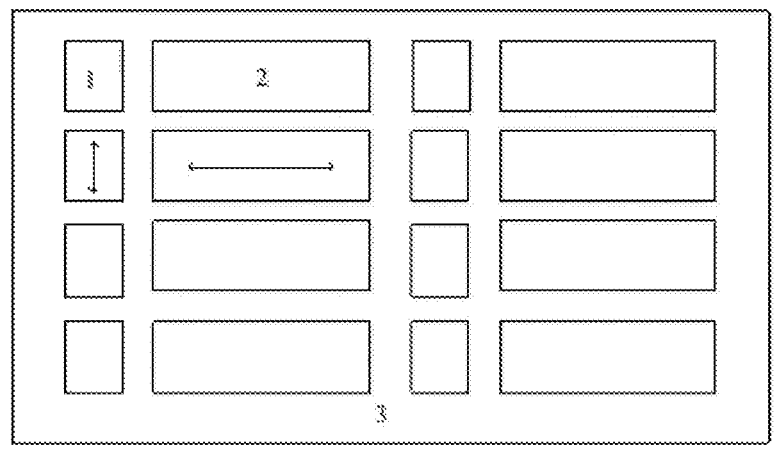
FIG. 1 is a schematic top view of a substrate of a MMG product.

FIG. 1 is a schematic top view of a substrate of a MMG product. As shown in FIG. 1, a plurality of products is arranged on the same substrate. In the present embodiment, two columns of products 1 and two columns of products 2 are arranged on a substrate 3. In a row direction, the products 1 and the products 2 are alternately arranged. Orientations of liquid crystal molecules of the product 1 and the product 2 are respectively shown by the arrows indicated on the product 1 and the product 2 in FIG. 1, respectively, which require different alignment lights for irradiation. Therefore, in the related art, it is necessary to continuously change masks during the production process to perform photo alignment to all of the products. Both of the two methods will cause manufacture of the mask to be difficult, and cause the cost to be relatively high.

Figure 2:
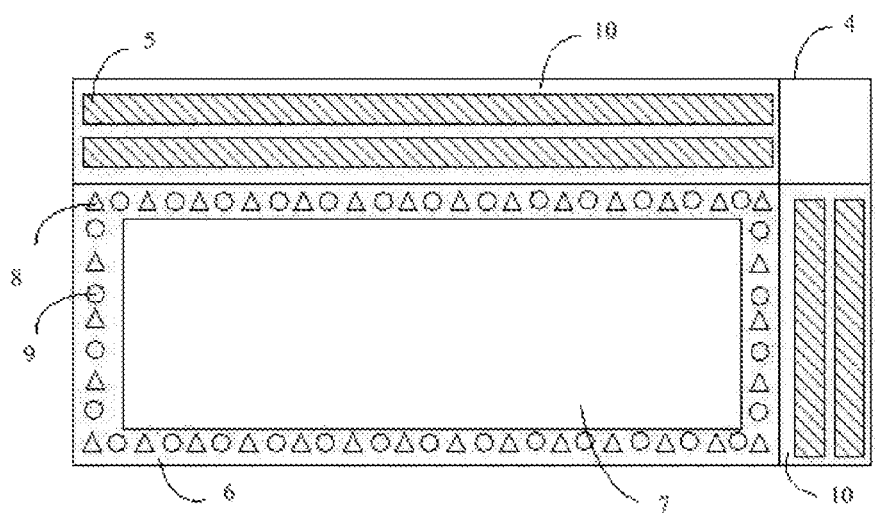
FIG. 2 is a schematic top view of a mask according to a first embodiment of the present disclosure.

FIG. 2 is a schematic top view of a mask provided by a first embodiment of the present disclosure. As shown in FIG. 2, a mask 4 comprises a plurality of baffles 5, a frame 6 and a light transmission region 7. A support component 8 and a movable component 9 are disposed on the frame. The baffle 5 is configured to block the light transmission region 7. The support component 8 is configured to support the baffle 5 which blocks the light transmission region 7. The movable component 9 is configured to move the baffle 5 to a position blocking the light transmission region 7.

The shapes and positions of the various parts in the drawings are for illustrative purposes only. For example, the support component 8 and the movable component 9 are shown in different shapes in the drawings, in order to distinguish between the two, and are not intended to limit the shapes thereof.

In addition, the mask 4 may also comprise a baffle storage case 10, which is configured to store the baffles 5. The baffle storage case 10 may be attached to the frame 6 or may be directly formed by forming a recessed structure on the frame 6.

According to the present embodiment, the mask 4 may block the light transmission region 7 with the plurality of baffles 5, to form different light transmission patterns, such that the mask 4 may be applied to production of different products. Moreover, during the production process of different products, it can eliminate the need for unloading and loading the mask 4, reducing the operation cost, and the mask can be well applied to the production of MMG products. The specific light transmission pattern can be specified by a user through a control system, or may be automatically generated by a control program of the control system.

In an embodiment of the present disclosure, the baffle 5 may also comprise a first baffle and a second baffle. A length direction of the first baffle is along a first direction, and a length direction of the second baffle is along a second direction. By providing two types of baffles and making the length directions of the two types of baffles to be different, it can reduce the types of the baffles and reduce the operation cost, and it can also ensure the adaptability of the light transmission pattern. Further, as shown in FIG. 2, the first direction and the second direction may be perpendicular to each other. Thus, while it can ensure the adaptability of the light transmission pattern, it can further simplify the movement, the support and the storage mechanism of the baffles 5.

In the embodiment of the present disclosure, when baffles 5 block the light transmission region 7, adjacent baffles 5 are partially overlapped with each other. Thus, it can prevent light leakage between the baffles 5.

Figure 3:
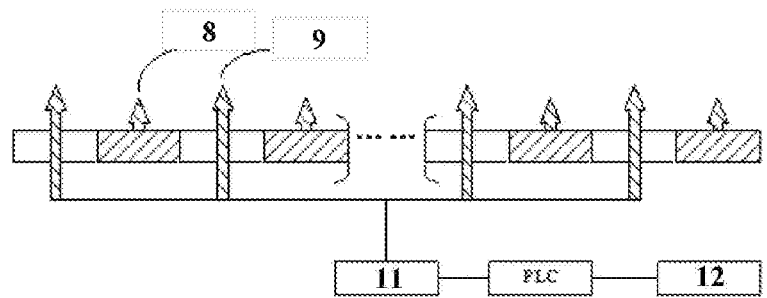
FIG. 3 is a schematic cross sectional view of a frame of the mask according to the embodiment as shown in FIG. 2.

FIG. 3 is a schematic cross sectional view of a frame of the mask according to the embodiment as shown in FIG. 2. As shown in FIG. 3, the support component 8 is a pillar-shaped structure in a fixed position, and is configured to support the baffle 5 which blocks the light transmission region 7. The movable component 9 is a pillar-shaped structure in a variable position, and is configured to move the baffles 5. The movable component 9 can be translated (or shifted horizontally) between a first position and a second position and can be raised or lowered. When being raised, the movable component 9 supports the baffle 5 and makes the baffle 5 to be detached from the support of the support component 8. When being lowered, the movable component 9 is detached from the baffle 5 and makes the baffle 5 to be supported by the support component 8. The first position and the second position refer to two different positions in the moving direction of the baffle 5.

The above movement of the movable component 9 may be carried out by any mechanical or electromechanical control means. In FIG. 3, the setting and movement of the positions of the baffles 5 are controlled by a system composed of a computer 12, a programmable logic controller (PLC) and actuator mechanism 11 after being programmed. Usage of the computer and PLC allows more precise and complex control of the positions of the baffles 5, extending scope of application of the mask and improving efficiency. However, it should be understood that, for example, in experimental application, it is also possible to directly control the movable component 9 by a technician through a mechanical mechanism and with a simple operation. Therefore, the example in FIG. 3 is merely for illustrative purposes and is not intended for limitation of the present disclosure.

Figures 4, 5:
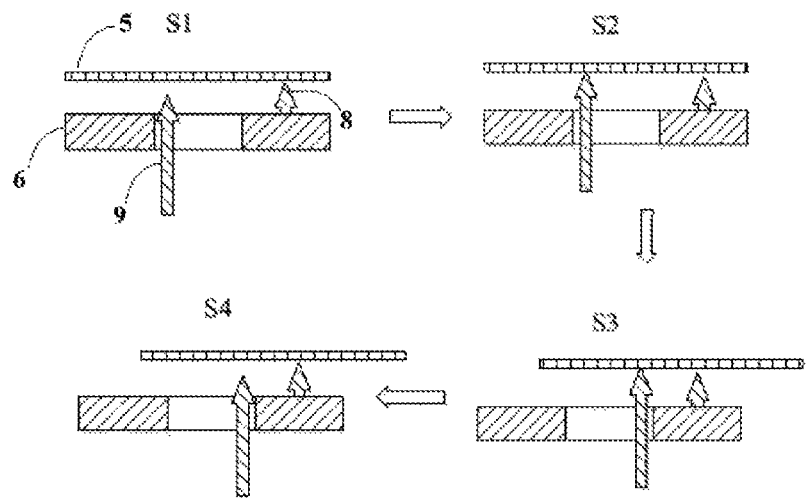
FIG. 4 is a schematic diagram of an operation process of a movable component in the mask according to the embodiment as shown in FIG. 2.
FIG. 5 is a schematic flow chart of a photo alignment method according to a second embodiment of the present disclosure.

FIG. 4 is a schematic diagram of an operation process of the movable component in the mask according to the embodiment as shown in FIG. 2. As shown in FIG. 4, in a first step (S1), the movable component 9 is in a lowering state and moves to the first position, and the baffle 5 is supported by the support component 8. In a second step (S2), the movable component 9 is raised to support the baffle, and makes the baffle 5 to be detached from the support of the support component 8. In a third step (S3), the movable component 9 is maintained in the raising state and moves to a second position, and the baffle 5 moves with the movable component 9. In a fourth step (S4), the movable component 9 is lowered at the second position and detached from the baffle 5. Then, the baffle 5 is supported by the support component 8. Thus, the baffle 5 completes one time of movement. With cooperation of the plurality of movable components 9, it can achieve the movement of the baffle 5 to any position of the light transmission region 7. The range of one time of movement of the movable components 9 may be set to 0~50 mm, to achieve a precise control of the position of the baffle 5.

FIG. 5 is a schematic flow chart of a photo alignment method according to a second embodiment of the present disclosure. As shown in FIG. 5, according to the second embodiment, there is provided a photo alignment method which uses the mask according to the first embodiment. The method comprises: according to positions of products arranged on the substrate, required times of photo alignment and an area required to be blocked on the light transmission region 7 of the mask 4 for each time of photo alignment are determined. According to the area required to be blocked on the light transmission region 7 of the mask 4 for each time of photo alignment, a required number and required positions of the baffles 5 are determined. When each time of photo alignment is performed, according to the required number and the required positions of the baffles 5 for the current time of photo alignment, the baffles 5 are moved to reach to corresponding positions, to block at least portion of the light transmission region 7 of the mask 4. Then, the substrate 3 is irradiated with an alignment light passing through the mask 4.

According to the photo alignment method in the present embodiment, for alignment of different products, there is no need to change the mask 4, but only needs to change the states of the baffles 5, which can implement alignment of various different products with simple steps.

Figure 6:
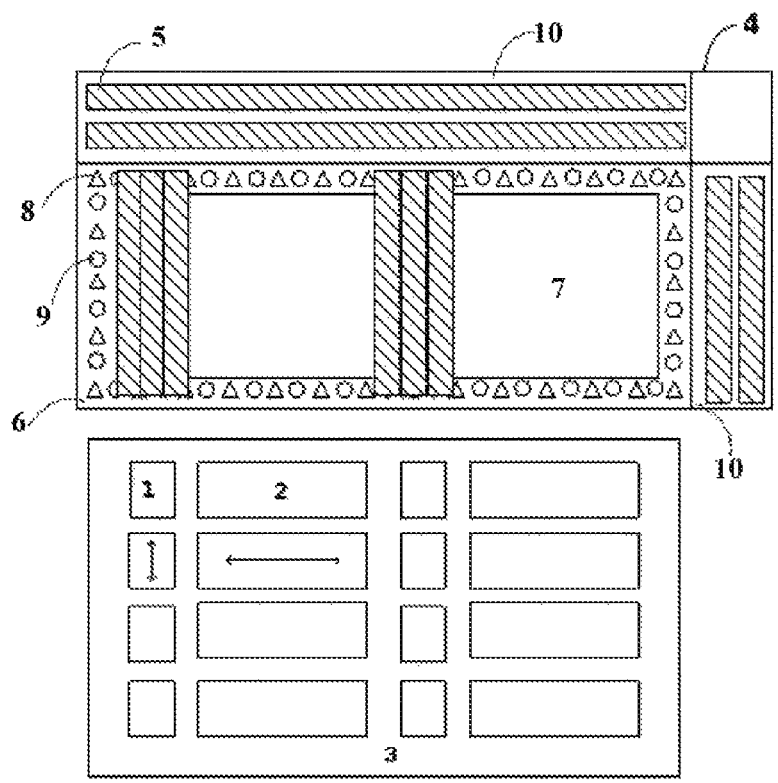
FIG. 6 is a schematic diagram of performing photo alignment to products 2 on a substrate 3 in FIG. 1.

FIG. 6 is a schematic diagram of performing photo alignment to the products 2 on the substrate 3 in FIG. 1. During a specific photo alignment process, the substrate 3 moves from downward to upward in the drawing, and enters a region covered by the mask 4. In the present embodiment, the alignment light will cause the liquid crystal molecules on the surface of the product to be arranged in the left and right direction in the drawing (i.e., the direction indicated on the product 2), and photo alignment may be directly performed on the products 2. Moreover, in the up and down direction, the products 2 are continuously arranged. Therefore, when the substrate 3 passes through the mask 4 from down to up for alignment, the blocking positions of the baffles 5 do not need to be adjusted. Accordingly, in the present embodiment, it is designed that photo alignment is firstly performed on the products 2. Moreover, during the process of the photo alignment of the products 2, the positions of the baffles 5 are set as shown in FIG. 6, and only baffles 5 which have length directions along the up and down direction are employed to block the positions of the products 1.

Figure 7:
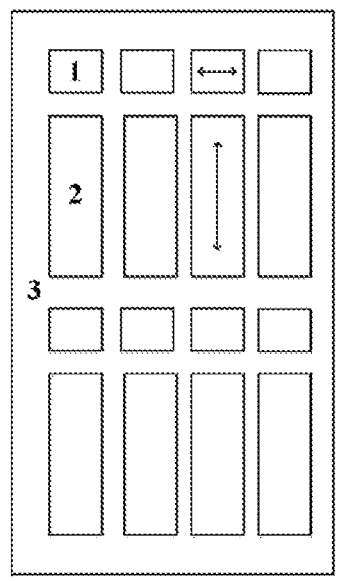
FIG. 7 is a schematic diagram of rotating the substrate before performing photo alignment to products 1 on the substrate 3 in FIG. 1.

FIG. 7 is a schematic diagram of rotating the substrate before performing photo alignment to products 1 on the substrate 3 in FIG. 1. As shown in FIG. 7, after photo alignment of the products 2 is completed, photo alignment of the products 1 is to be performed. Since the products 1 requires arrangement directions of the liquid crystal molecules to be perpendicular to the direction in which the alignment light can be generated, the substrate 3 is first rotated, such that the arrangement directions of the liquid crystal molecules required by the products 1 to be the same as the direction in which the alignment light can be generated. Likewise, during the process of photo alignment of the products 1, the substrate 3 moves from down to up and enters the region covered by the mask 4 again.

Figure 8:
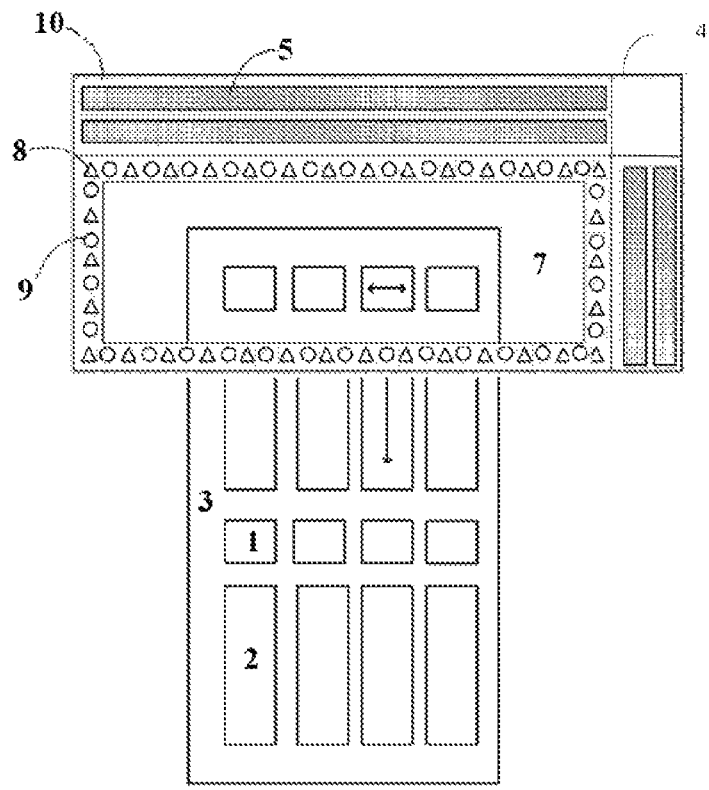
FIG. 8 is a schematic diagram of performing photo alignment to a first column of products 1 on the substrate 3 in FIG. 1.

FIG. 8 is a schematic diagram of performing photo alignment to a first column of products 1 on the substrate 3 in FIG. 1. As shown in FIG. 8, after the substrate 3 is rotated, in the up and down direction, a product 2 is disposed between products 1. At this time, the product 2 cannot receive irradiation of the alignment light. Therefore, the photo alignment of the products 1 cannot be performed continuously, but need to be performed step by step. Moreover, the positions of the baffles 5 require corresponding adjustment.

As shown in FIG. 8, firstly, the first column (i.e. the first row as shown in FIG. 8 after the substrate 3 is rotated) of products 1 is caused to enter the light transmission region 7 to be performed with photo alignment. At this time, since the products 2 have not entered the light transmission region 7, the baffles 5 do not needed to be employed.

Figure 9:
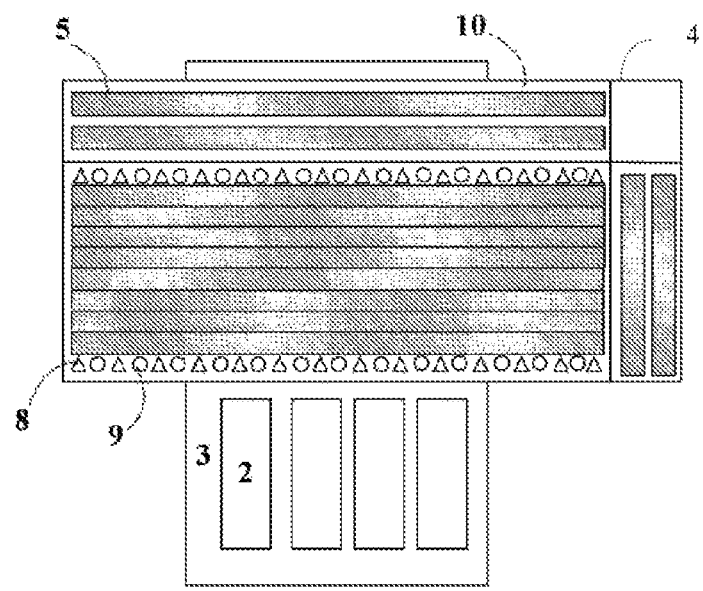
FIG. 9 is a schematic diagram of blocking a first column of products 2 on the substrate 3 in FIG. 1.

FIG. 9 is a schematic diagram of blocking a first column of products 2 on the substrate 3 in FIG. 1. As shown in FIG. 9, with the substrate 3 further moves upward, the first column of products 2 enters the light transmission region 7. Therefore, the baffles 5 are employed to completely block the light transmission region 7.

Figure 10:
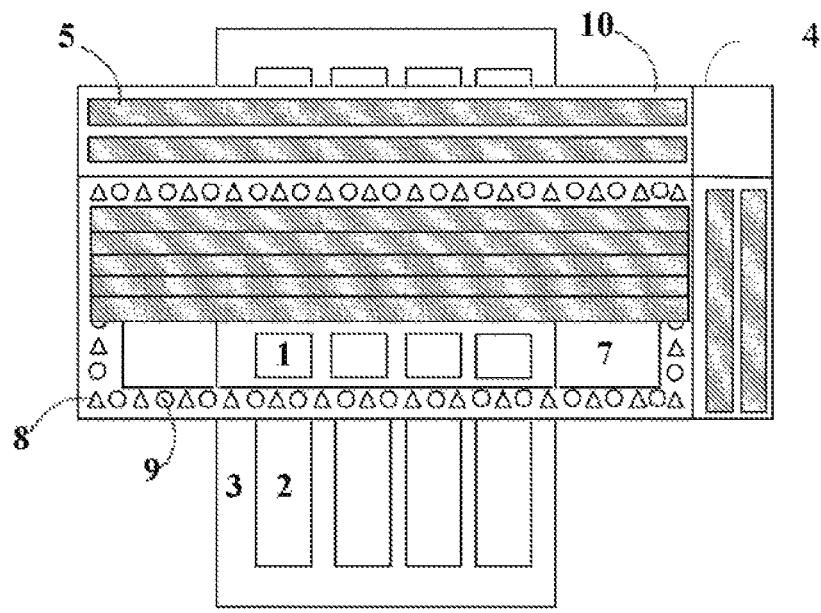
FIG. 10 is a schematic diagram of performing photo alignment to a second column of products 1 on the substrate 3 in FIG. 1.

FIG. 10 is a schematic diagram of performing photo alignment to a second column of products 1 on the substrate 3 in FIG. 1. As shown in FIG. 9, with the substrate 3 further moves upward, the second column of products 1 enters the light transmission region 7. At this time, there are still products 2 in the light transmission region. Therefore, the baffles 5 are employed to partly block the light transmission region 7, such that the products 1 can receive irradiation of the alignment light, while the products 2 cannot receive irradiation of the alignment light.

Figure 11:
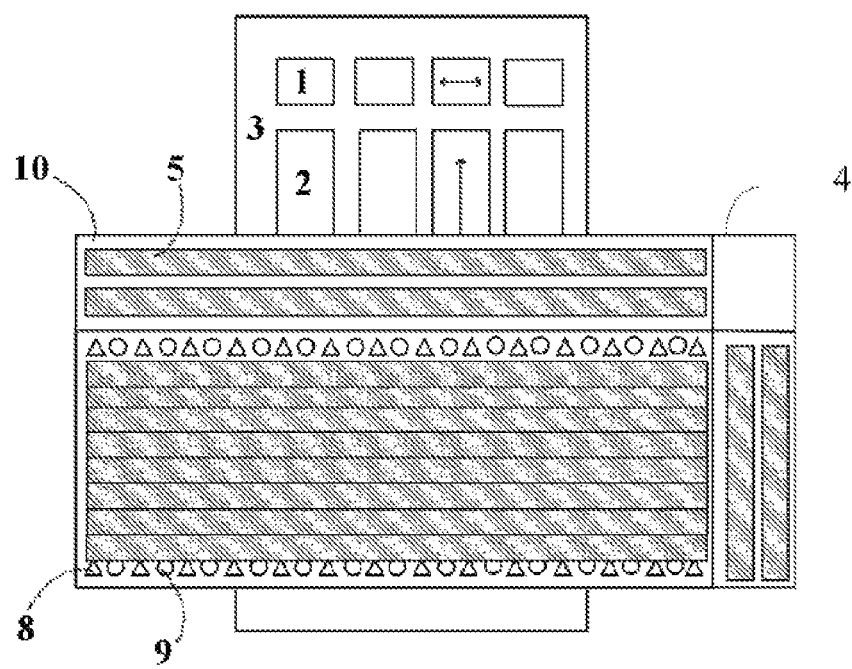
FIG. 11 is a schematic diagram of blocking a second column of products 2 on the substrate 3 in FIG. 1.

FIG. 11 is a schematic diagram of blocking a second column of products 2 on the substrate 3 in FIG. 1. As shown in FIG. 9, with the substrate 3 further moves upward, the second column of products 2 enters the light transmission region 7. Since the photo alignment of the products 1 has been completed, the irradiation of the alignment light is not needed. Therefore, the baffles 5 are employed to completely block the light transmission region 7. At this time, the photo alignment of all the products on the substrate 3 has been completed. Moreover, the substrate 3 keeps moving to enter other processes.

According to the embodiment of the present disclosure, the mask 4 may be applied for production of different products. Moreover, during the production process of different products, it can eliminate the need for unloading and loading the mask 4, reducing the operation cost, and the mask can be well applied to the production of MMG products. When using the mask 4 to perform photo alignment, for alignment of different products, only the states of the baffles 5 need to be changed, which is capable of achieving alignment of various different products with simple steps.

In the description of the present disclosure, it should be noted that, azimuth or positional relationships indicated by terms "upper", "lower" and the like is based on the azimuth or positional relationship shown in the drawings, which is only for ease of description of the present disclosure and simplification of the description, rather than indicating or implying that the device or element referred to must have a specific orientation, or must be constructed and operated in a particular orientation, and therefore cannot be construed as limiting the present disclosure. Unless expressly prescribed and defined otherwise, terms "disposed", "connected" or "bonding" should be broadly understood, for example, it may be a fixed connection, a detachable connection, or an integral connection; or may be a mechanical connection, and may also be an electrical connection; it may be directly connected, and may also be indirectly connected through an intermediate medium, or may be a communication within two elements. The specific meanings of the above terms in the present disclosure may be understood by those of ordinary skill in the art in light of specific circumstances.

It is to be noted that, in this context, relational terms such as first, second or the like are used only to distinguish one entity or operation from another entity or operation without necessarily requiring or implying that there is any such actual relationship or sequence between these entities or operations. Moreover, the term such as "including", "including" or any other variant thereof is intended to encompass a non-exclusive inclusion such that processes, methods, articles or devices that include a series of elements include not only those elements but also those that are not explicitly listed, or include other elements that are inherent to such processes, methods, articles or devices. In the absence of further restriction, the element defined by the statement "including a . . . " does not preclude the presence of additional same elements in the process, method, article, or device that includes the elements.

It is to be noted that the foregoing embodiments are merely exemplary embodiments for illustrating the principle of the present disclosure. However, the present disclosure is not limited thereto. It will be apparent to those skilled in the art that various alterations and modifications can be made without departing from the spirit and essence of the present disclosure, which are also considered to be within the scope of the present disclosure.

What is claimed is:

1. A mask, comprising a baffle in a strip shape, a frame and a light transmission region defined in the frame, wherein
    the frame comprises a support component and a movable component are disposed on the frame;
    the baffle is configured to block the light transmission region;
    the support component is configured to support the baffle which blocks the light transmission region; and
    the movable component is configured to move the baffle to be supported by the support component of the frame at a position where the light transmission region is to be blocked by the baffle.

2. The mask of claim 1 further comprising a baffle storage case configured to store the baffle.

3. The mask of claim 1, wherein the support component is a pillar shaped structure in a fixed position.

4. The mask of claim 1, wherein the movable component is a pillar shaped structure in a variable position; the movable component translates between a first position and a second position and performs raising and lowering actions; when the movable component is raised, the movable component supports the baffle and causes the baffle to be detached from support of the support component, and when the movable component is lowered, the movable component is detached from the baffle and causes the baffle to be supported by the support component.

5. The mask of claim 1, wherein the baffle comprises a first baffle and a second baffle, a length direction of the first baffle is along a first direction, and a length direction of the second baffle is along a second direction.

6. The mask of claim 5, wherein the first direction is perpendicular to the second direction.

7. The mask of claim 1, wherein when a plurality of baffles are disposed to block the light transmission region, adjacent baffles are partially overlapped with each other.

8. A photo alignment method using the mask of claim 1, comprising:
    determining required times of photo alignment and an area required to be blocked on the light transmission region of the mask for each time of photo alignment, according to positions of products arranged on the substrate;
    determining a required number and required positions of baffles according to the area required to be blocked on the light transmission region of the mask for each time of photo alignment; and
    when each time of photo alignment is performed, according to the required number and the required positions of the baffles for the current time of photo alignment, moving the baffles to reach to corresponding positions, to block at least portion of the light transmission region of the mask, and then, irradiating the substrate with an alignment light passing through the mask.

* * * * *